United States Patent
Lin et al.

(10) Patent No.: US 6,251,700 B1
(45) Date of Patent: Jun. 26, 2001

(54) METHOD OF MANUFACTURING COMPLEMENTARY METAL-OXIDE-SEMICONDUCTOR PHOTOSENSITIVE DEVICE

(75) Inventors: Wei-Chiang Lin, Hsinchu; Yuan-Chi Pai, Nantou, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/135,070

(22) Filed: Aug. 17, 1998

(30) Foreign Application Priority Data

Jun. 16, 1998 (TW) ................................................ 87109588

(51) Int. Cl.⁷ .............................................. H01L 21/339
(52) U.S. Cl. .............................. 438/70; 438/60; 438/69; 438/75
(58) Field of Search .................................. 438/57, 60, 65, 438/66, 69, 70, 71, 73, 75, 435, 436, 437, 438; 257/173, 116

(56) References Cited

U.S. PATENT DOCUMENTS

| | | | |
|---|---|---|---|
| 4,749,662 | * | 6/1988 | Custode ................................. 437/58 |
| 5,216,414 | * | 6/1993 | Fukutani ............................... 340/784 |
| 5,266,501 | * | 11/1993 | Imai ......................................... 437/2 |
| 5,404,005 | * | 4/1995 | Shimomura et al. ............. 250/208.1 |
| 5,554,446 | * | 9/1996 | Matsushima et al. ................... 430/7 |
| 5,561,319 | * | 10/1996 | Owens et al. ......................... 257/649 |
| 5,593,913 | * | 1/1997 | Aoki ....................................... 437/53 |
| 5,595,930 | * | 1/1997 | Baek ...................................... 437/53 |
| 5,604,362 | * | 2/1997 | Jedlicka et al. ....................... 257/233 |
| 5,739,562 | * | 4/1998 | Ackland ................................ 257/291 |
| 5,747,790 | * | 5/1998 | Shimomura et al. ............. 250/208.1 |
| 5,853,960 | * | 12/1998 | Tran ...................................... 430/321 |
| 5,859,450 | * | 1/1999 | Clark et al. .......................... 257/233 |
| 5,965,452 | * | 10/1999 | Kovacs ................................. 436/149 |

* cited by examiner

Primary Examiner—Stephen D. Meier
Assistant Examiner—David Goodwin
(74) Attorney, Agent, or Firm—Thomas, Kayden, Horstemeyer & Risley, LLP

(57) ABSTRACT

A method of fabricating a complementary metal-oxide-semiconductor (CMOS) photosensitive device. In this method, a wafer substrate is provided. Then, a first passivation layer is formed over the wafer substrate. The first passivation layer, which is made from a material that includes silicon nitride or silicon oxide, is heated so that it melts. Then, color filters including a red filter region, a green filter region and a blue filter region are formed over the first passivation layer. The color filters are used to filter out different colors of monochromatic light. The color filters are made from a material that includes acrylic. Subsequently, a second passivation layer having a planar top surface is formed over the color filters. The second passivation layer is made from a material that includes silicon nitride or silicon oxide. Next, photolithographic and etching operations are carried out to form an opening through the second passivation layer and the first passivation layer. This opening exposes the substrate wafer. Finally, a micro-lens layer is formed over the second passivation layer such that an individual micro-lens is positioned above each color filter.

20 Claims, 7 Drawing Sheets

METHOD OF MANUFACTURING COMPLEMENTARY METAL-OXIDE-SEMICONDUCTOR PHOTOSENSITIVE DEVICE

CROSS-REFERENCE TO RELATED APPLICATION

This application claims the priority benefit of Taiwan application Ser. No. 87109588, filed Jun. 16, 1998, the full disclosure of which is incorporated herein by reference.

BACKGROUND OF THE INVENTION

1. Field of Invention

The present invention relates to a method of manufacturing complementary metal-oxide-semiconductor (CMOS) photosensitive devices. More particularly, the present invention relates to a method of manufacturing the color filter of a CMOS photosensitive device that reduces the number of fabricating steps, and thus saves processing time and production cost.

2. Description of Related Art

CMOS diode devices are commonly used inside conventional PC cameras and digital cameras. In general, a CMOS diode device comprises a photosensitive layer on a wafer substrate, and there are various light-sensitive regions in the photosensitive layer for the purpose of sensing different colors of light. Furthermore, a color filter is formed above the photosensitive layer, and a film is formed to cover the color filter. In general, light of different colors comes from various directions. When the incoming light passes through the color filter, it is filtered into three colors, for example, red, green and blue, and then is absorbed and detected by the corresponding light-sensitive regions of the photosensitive layer.

FIG. 1 is a flow chart showing the manufacturing steps for fabricating a conventional CMOS photosensitive device. First, in step 10, a first passivation layer is formed over a wafer substrate. Next, a photolithographic process 11 is carried out to form a patterned photoresist layer on the first passivation layer. Thereafter, the first passivation layer is etched in operation 12 using the photoresist layer as a mask. Subsequently, a melting, operation 13 is carried out by heating the first passivation layer. Next, step 14 is carried out to form color filters over the first passivation layer. The color filters are used to filter incoming light so that monochromatic light of different colors is produced. After that, step 15 is carried out to form a planar second passivation layer over the color filters. Then, another photolithographic operation 16 is performed, forming another patterned photoresist layer over the second passivation layer. Next, the second passivation layer is etched in operation 17, using the photoresist layer as a mask. Finally, step 18 is carried out in which micro-lenses are formed on top of the second passivation layer, in locations that correspond to the color filters.

FIGS. 2A through 2K are cross-sectional views showing the progression of manufacturing steps in fabricating a CMOS photosensitive device according to a conventional method. First, as shown in FIG. 2A, a wafer substrate 20 is provided, and a patterned first passivation layer 21 is formed over the wafer substrate 20. Next, as shown in FIG. 2B, a first photoresist layer 22 is formed over the first passivation layer 21, and then the first photoresist layer 22 is patterned. Next, as shown in FIG. 2C, using the patterned first photoresist layer 22 as a mask, the first passivation layer 21 is etched to form an opening 23 that exposes a portion of the wafer substrate 20. The opening 23 is used as a connection pad in subsequent step. Next, as shown in FIG. 2D, the first photoresist layer 22 is removed.

Next, as shown in FIG. 2E. a transparent layer 24 having a planar surface is formed over the first passivation layer 21, the wafer substrate 20 and into the opening 23. Subsequently, as shown in FIG. 2F, color filters including a red filter region 25a, a green filter region 25b and a blue filter region 25care formed over the planar transparent layer 24. The color filters are made from a material including acrylic. Next, as shown in FIG. 2G, a second passivation layer 26 having a planar surface is formed over the red filter region 25a, the green filter region 25b, the blue filter region 25c and the transparent layer 24. Next, as shown in FIG. 2H, a second photoresist layer 27 is formed over the second passivation layer 26, and then the second photoresist layer 27 is patterned.

Next, as shown in FIG. 2I, using the patterned second photoresist layer 27 as a mask, the second passivation layer 26 and the transparent layer 24 are etched to form an opening 23a that exposes the wafer substrate 20. The opening 23a serves as a connection pad in subsequent steps. Next, as shown in FIG. 2J, the second photoresist layer 27 is removed. Finally, as shown in FIG. 2K, micro-lens 29a, 29b and 29c are formed over the second passivation layer 26. Micro-lens 29a, 29b and 29c are located above the red filter region 25a, the green filter region 25b and the blue filter region 25c, respectively. In this manner, fabrication of a conventional CMOS photosensitive device is complete.

However, the above method of forming a CMOS photosensitive device has a number of defects, including:

1. The manufacturing operation involves lot of steps. In particular, after the color filters 25 are formed over the first passivation layer 24, another photolithographic and etching operation for another passivation layer has to be carried out. Therefore, cycle time and hence the production cost is increased.

2. The pad opening 23 formed early in the process and may lead to pad charge or pad pit problems when the photoresist is reworked.

In light of the foregoing, there is a need to provide an improved method of manufacturing a CMOS photosensitive device.

SUMMARY OF THE INVENTION

Accordingly, the present invention provides a method of fabricating a CMOS photosensitive device that combines a two-step pad opening operation into one so that only one photolithographic and etching operation of the passivation layer is necessary after the color filters are formed. With this arrangement, the number of fabrication steps is reduced. Moreover, pad charge and pad pit problems are also avoided.

To achieve these and other advantages and in accordance with the purpose of the invention. as embodied and broadly described herein, the invention provides a method of fabricating a CMOS photosensitive device. In this method, a wafer substrate is provided and then a first passivation layer is formed over the wafer substrate. Next, the first passivation layer is heated so that it melts. The purpose of melting the first passivation layer is to densify it and relieve its internal stress. The first passivation layer is made from a material that includes silicon nitride or silicon oxide. Thereafter, color filters including a red filter region, a green filter region and a blue filter region are formed over the first passivation layer. The color filters are used to filter out monochromatic light of different colors. The color filters are made from a material that includes acrylic. Subsequently a second passivation layer having a planar top surface is formed over the color filters. The second passivation layer is made from a material that includes silicon nitride or silicon oxide.

Next, photolithographic and etching operations are carried out to form an opening through the second passivation layer and the first passivation layer exposing the substrate wafer. Finally, a micro-lens layer is formed over the second passivation layer such that an individual micro-lens is positioned above each color filter. The micro-lenses can be formed using photoresist material.

It is to be understood that both the foregoing general description and the following detailed description are exemplary. and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
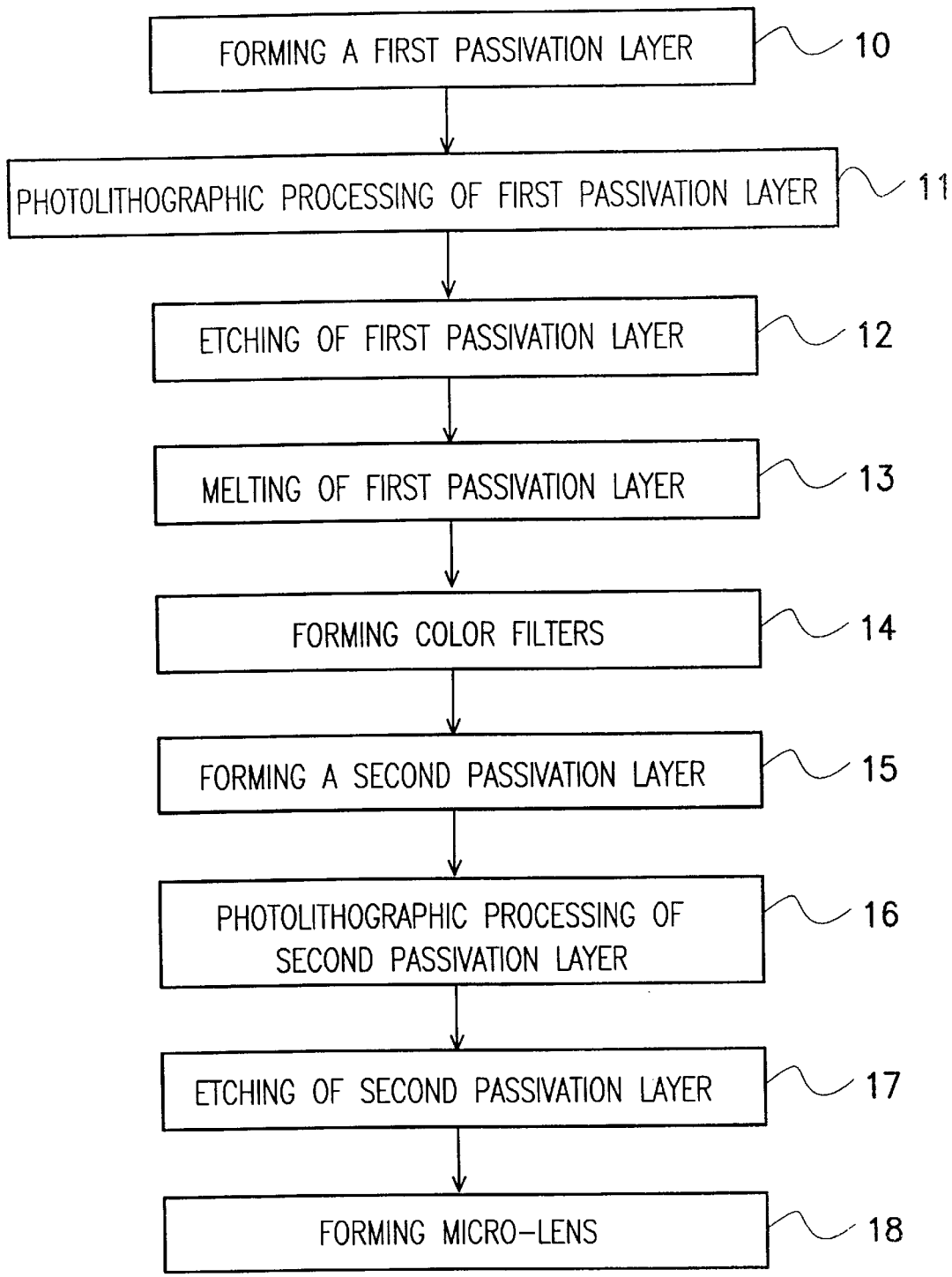
FIG. 1 is a flow chart showing the manufacturing steps for fabricating a conventional CMOS photosensitive device.
Figure 2A:
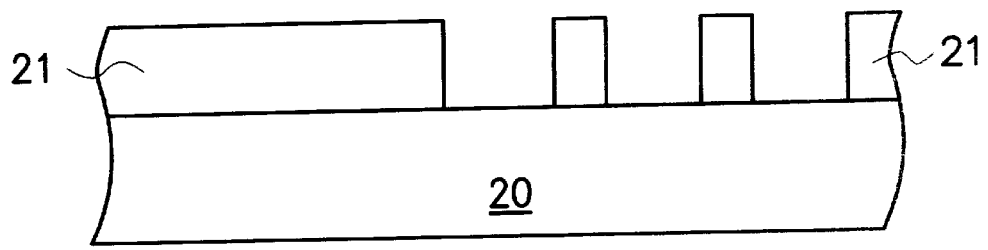
FIGS. 2A through 2K are cross-sectional views showing the progression of manufacturing steps in fabricating a CMOS photosensitive device according to a conventional method.
Figure 2B:
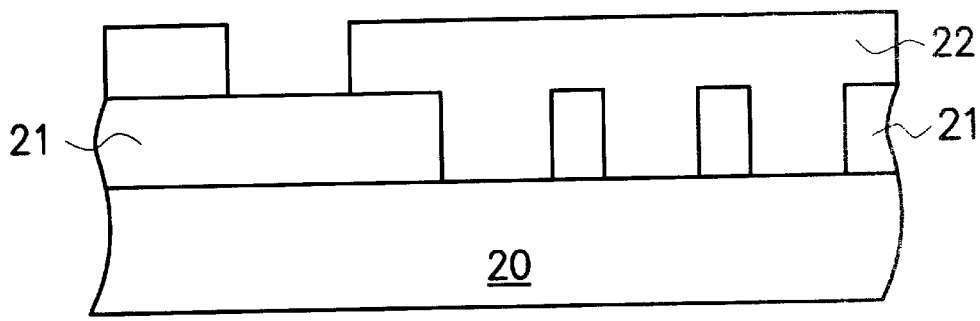
Figure 2C:
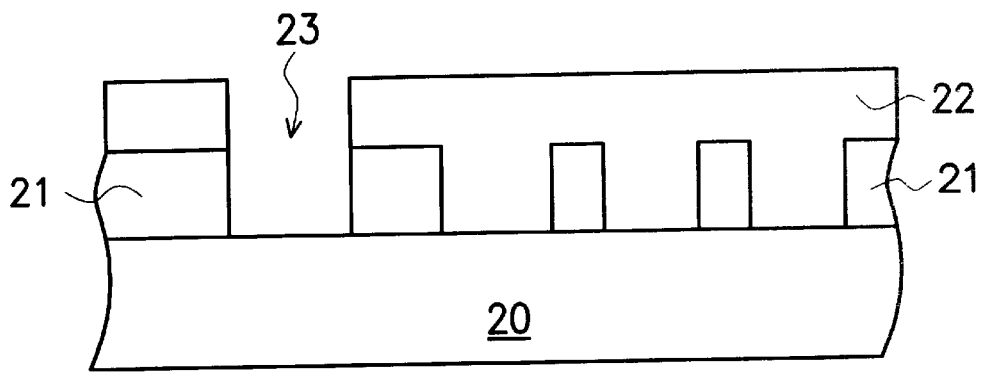
Figure 2D:
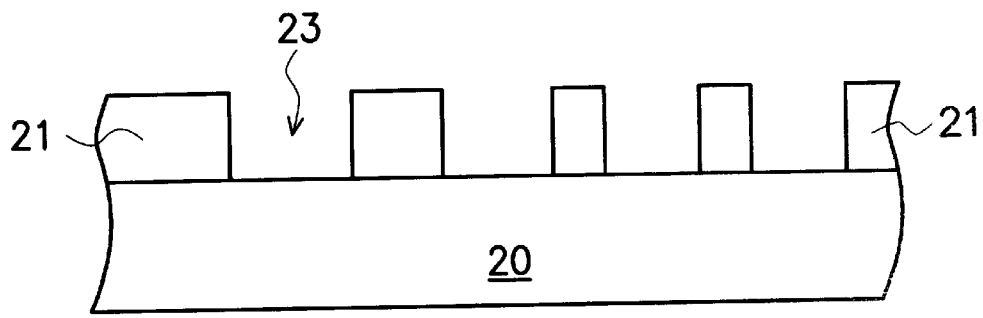
Figure 2E:
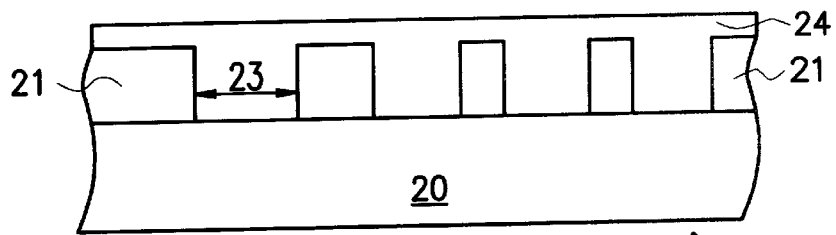
Figure 2F:
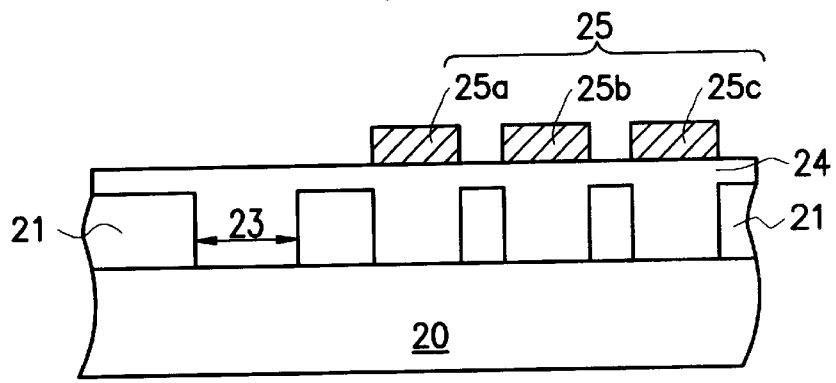
Figure 2G:
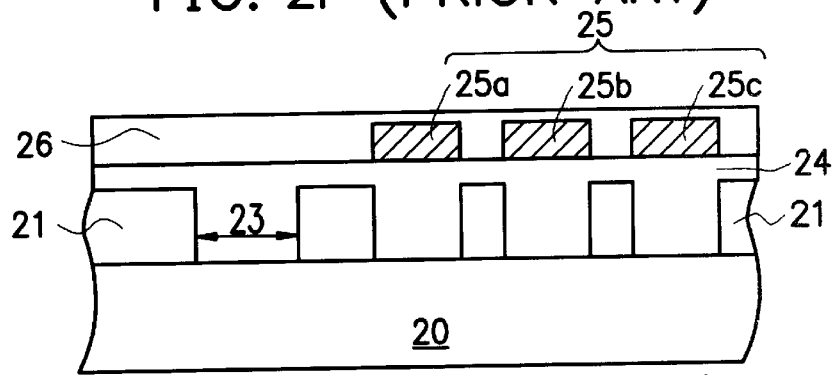
Figure 2H:
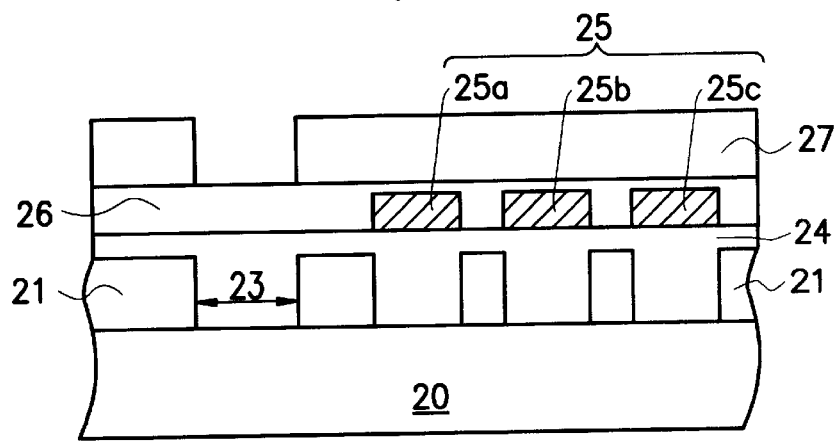
Figure 2I:
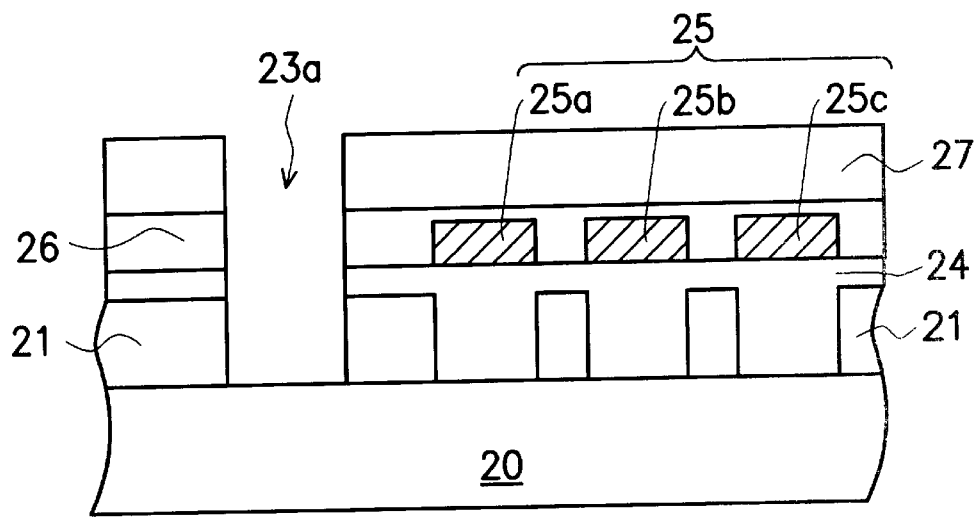
Figure 2J:
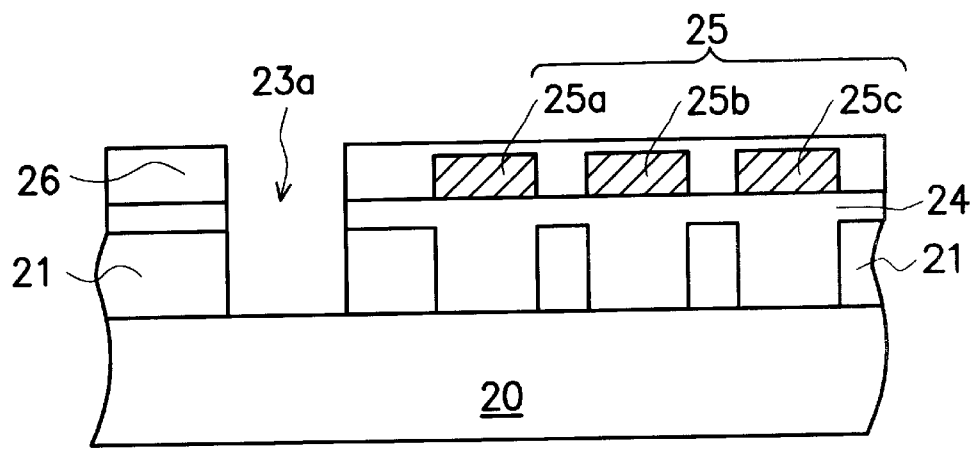
Figure 2K:
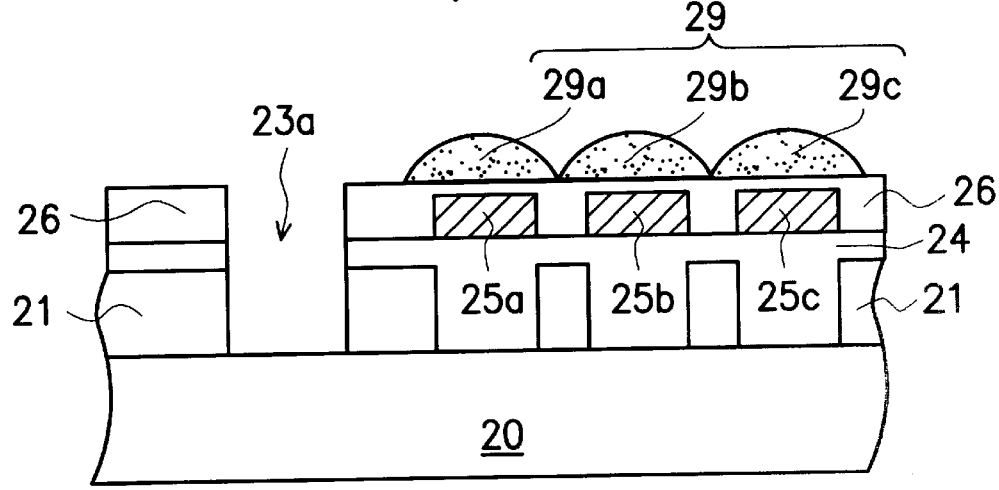

Reference will now be made in detail to the present preferred embodiments of the invention, examples of which are illustrated in the accompanying drawings. Wherever possible the same reference numbers are used in the drawings and the description to refer to the same or like parts.

According to the method of fabricating a CMOS photosensitive device in this invention, only one photolithographic and etching operation on the passivation layer is necessary to form the pad opening after the color filters are formed. With this arrangement, cycle time and hence production cost is greatly reduced.

Figure 3:
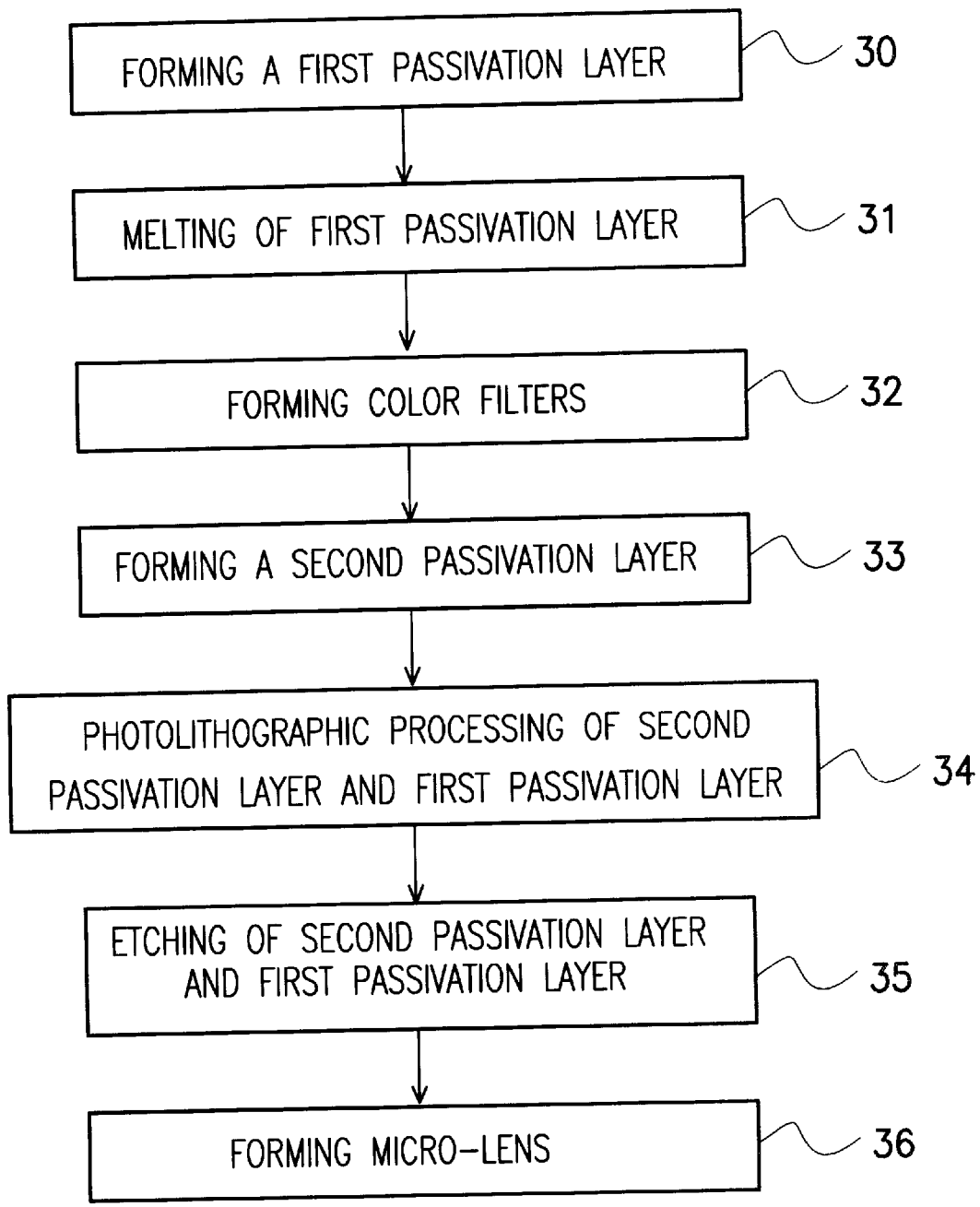
FIG. 3 is a flow chart showing the manufacturing steps for fabricating a CMOS photosensitive device according to one preferred embodiment of this invention.

FIG. 3 is a flow chart showing the manufacturing steps for fabricating a CMOS photosensitive device according to one preferred embodiment of this invention. First, step 30 is carried out to form a first passivation layer over a wafer substrate, and then a photolithographic operation 31 performed to heat the first passivation layer and melt it. Next, step 32 is carried out to form color filters over the first passivation layer so that light of different colors can be filtered. Thereafter, step 33 is executed to form a second passivation layer having a planar top surface over the color filters. Next, in step 34, a patterned photoresist layer is formed over the second passivation layer. Then, using the patterned photoresist layer as a mask, the second passivation layer and the first passivation layer are etched. Finally, in step 36, micro-lenses are formed over the second passivation layer such that one lens is located above each color filter.

Figure 4A:
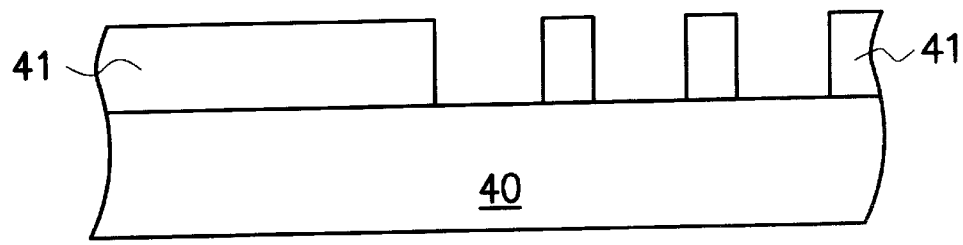
FIGS. 4A through 4H are cross-sectional views showing the progression of manufacturing steps in fabricating a CMOS photosensitive device according to one preferred embodiment of this invention.

FIGS. 4A through 4H are cross-sectional views showing the progression of manufacturing steps in fabricating a CMOS photosensitive device according to one preferred embodiment of this invention. First, as shown in FIG. 4A, a wafer substrate 40 having light-sensitive regions (not shown in the figure) is provided. The light-sensitive regions absorb and sense light of different colors. Next, a patterned first passivation layer 41 is formed over the wafer substrate 40, and then the first passivation layer 41 is heated to melt it. The purpose of melting the first passivation layer 41 is to densify the first passivation layer 41 so that stress within the first passivation layer 41 is relieved. Material for forming the first passivation layer 41 includes silicon nitride or silicon oxide.

Figure 4B:
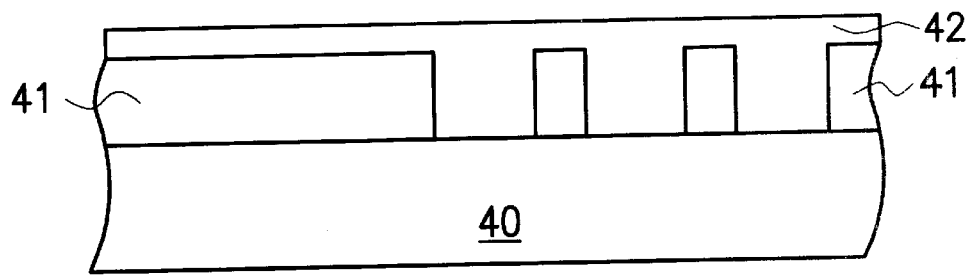
Figure 4C:
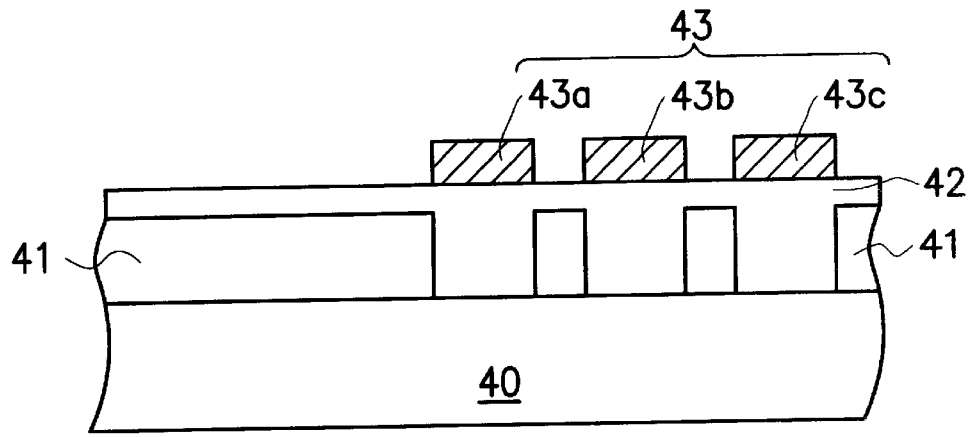

Next, as shown in FIG. 4B, a transparent layer 42, preferably made from acrylic, is formed over the first passivation layer 41. Thereafter, as shown in FIG. 4C, color filters 43 including a red filter region 43a, a green filter region 43b and a blue filter region 43c, preferably made from acrylic, are formed over the transparent layer 42. The method of forming the color filters includes an electrolysis method, a dye method or a pigment diffusion method.

Figure 4D:
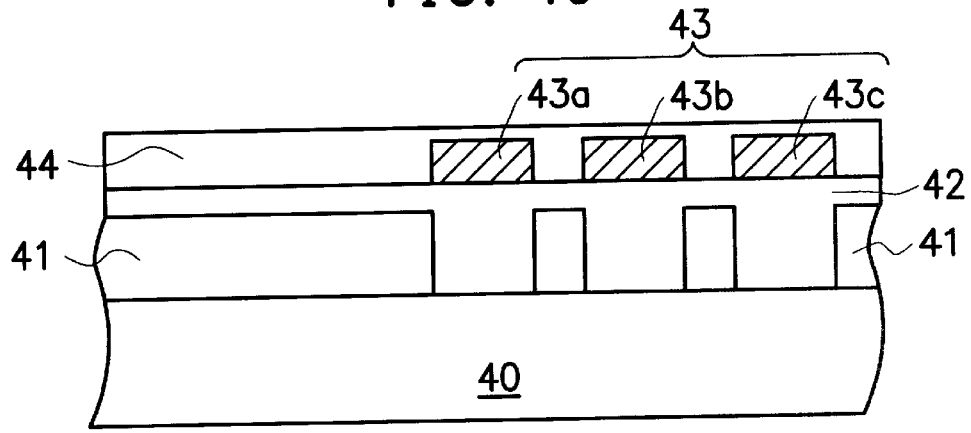
Figure 4E:
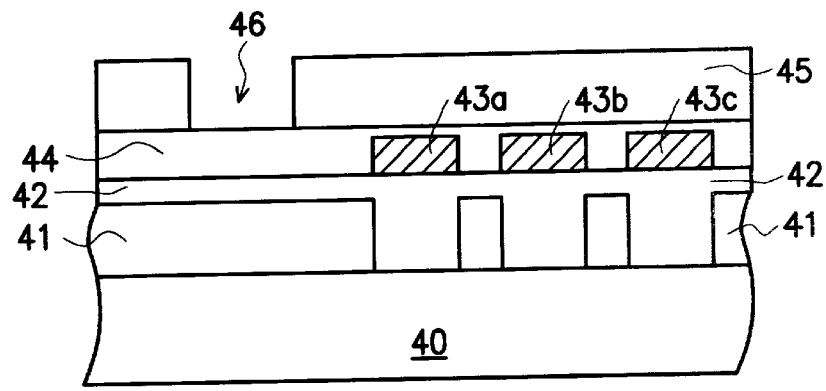
Figure 4F:
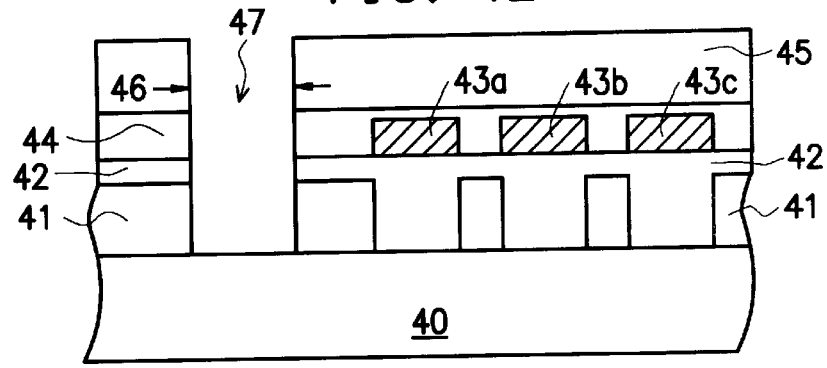

Next, as shown in FIG. 4D, a second passivation layer 44 having a planar surface is formed over the transparent layer 42 and the color filters 43. The second passivation layer 44 is made from materials including silicon nitride or silicon oxide. Subsequently, as shown in FIG. 4E. a photoresist layer 45 is formed over the second passivation layer 44. Thereafter, the photoresist layer 45 is patterned forming an opening 46 in the photoresist layer 45. Next, as shown in FIG. 4F, using the patterned photoresist layer 45 as a mask, the second passivation layer 44, the transparent layer 42 and the first passivation layer 41 are etched to form an opening 47 that exposes a portion of the wafer substrate 40. The opening 47 functions as a connection pad in subsequent processes.

Figure 4G:
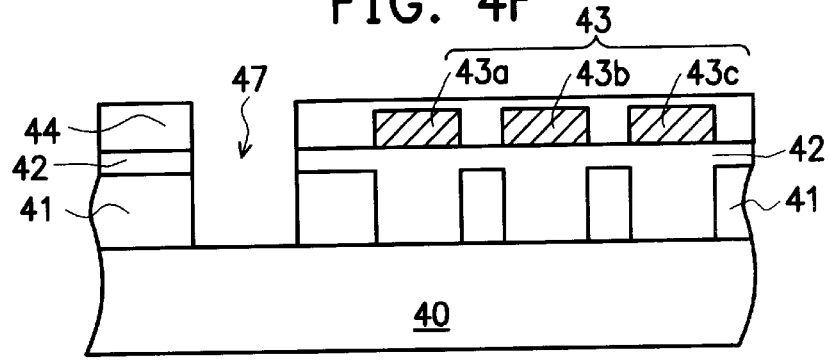
Figure 4H:
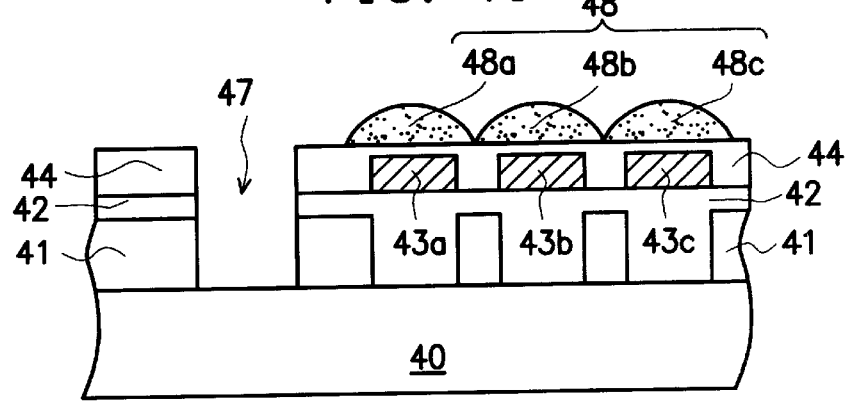

Next, as shown in FIG. 4G, the photoresist layer 45 is removed. Then, as shown in FIG. 4H, a micro-lens layer 48 is formed over the second passivation layer 44 with the respective lenses 48a, 48b and 48c formed above the respective red filter region 43a, the green filter region 43b and the blue filter region 43c. Normally, the micro-lens layer 48 is formed from photoresist material. Finally, a complete CMOS photosensitive device is formed.

In general, light that shines onto the wafer substrate 40 is composed of various colors and at various angles. When the incoming light passes through the color filters 43, it is separated into red, green and blue light by the respective red filter region 43a, green filter region 43b and blue filter region 43c. Subsequently, different colors of light are be absorbed and sensed by the layer of photosensitive material in the wafer substrate 40.

In summary, the advantages of using the method of this invention to fabricate CMOS photosensitive devices include:

1. The number of steps required to fabricate the photosensitive device is reduced. There is no need to perform another photolithographic and etching operation on the passivation layer before the formation of color filters 43. Hence, production cycle time is shortened and hence cost is reduced.

2. Pad opening 47 is formed in a single operation after color filters are formed. Consequently problems such as pad charge or pad pit due to photoresist rework are avoided. Hence, the number of photoresist rework can be increased without any damages to the pad opening and so product quality and yield are both increased.

3. The techniques and equipment used to perform photolithographic and etching operations in this invention are the same as in a conventional process. Therefore, this invention is suitable for forming color filters on all types of CMOS photosensitive device devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing complementary metal-oxide-semiconductor (CMOS) photosensitive device, comprising the steps of:

providing a wafer substrate;

forming a first passivation layer over the substrate wafer, wherein the first passivation layer includes one selected from the group consisting of silicon oxide and silicon nitride;

melting the first passivation layer;

forming color filters on the first passivation layer so that different colors of light are filtered out;

forming a second passivation layer having a planar top surface on the color filters; and performing a photolithographic and etching operation to form a pad opening through the second passivation layer and the first passivation layer, and exposing a portion of the wafer substrate.

2. The method of claim 1, wherein the step of melting the first passivation layer includes heating the passivation layer so as to increase density and decrease stress within the first passivation layer.

3. The method of claim 1, wherein the color filters are made from a material that includes acrylic.

4. The method of claim 1, wherein the step of forming the color filters includes an electrolysis method.

5. The method of claim 1, wherein the step of forming the color filters includes a dyeing method.

6. The method of claim 1, wherein the step of forming the color filters includes a pigment diffusion method.

7. The method of claim 1, wherein the step of forming the second passivation layer includes depositing silicon oxide.

8. The method of claim 1, wherein the step of forming the second passivation layer includes depositing silicon nitride.

9. The method of claim 1, wherein after forming the pad opening, further includes forming a micro-lens layer on top of the second passivation layer with each micro-lens located above each color filter.

10. A method of manufacturing a complementary metal-oxide-semiconductor (CMOS) photosensitive device, the method comprising the steps of:

providing a wafer substrate;

forming a first passivation layer over the substrate wafer;

melting the first passivation layer;

forming color filters on the first passivation layer, wherein the color filters include at least a red filter region, a green filter region and a blue filter region so that light of different colors are filtered out;

forming a second passivation layer having a planar top surface over the color filters;

performing one photolithographic and etching operation to form a pad opening through the second passivation layer and the first passivation layer, and exposing a portion of the wafer substrate; and forming a micro-lens layer on top of the second passivation layer after the pad opening is formed, wherein the micro-lens layer includes a plurality of micro-lens with a micro-lens above each color filter.

11. The method of claim 10, wherein the step of forming the first passivation layer includes depositing silicon oxide.

12. The method of claim 10, wherein the step of forming the first passivation layer includes depositing silicon nitride.

13. The method of claim 10, wherein the step of melting the first passivation layer includes heating the passivation layer to increase density and decrease stress within the first passivation layer.

14. The method of claim 10, wherein the color filters are made from a material that includes acrylic.

15. The method of claim 10, wherein the step of forming the color filters includes an electrolysis method.

16. The method of claim 10, wherein the step of forming the color filters includes a dyeing method.

17. The method of claim 10, wherein the step of forming the color filters includes a pigment diffusion method.

18. The method of claim 10, wherein the step of forming the second passivation layer includes depositing silicon oxide.

19. The method of claim 10, wherein the step of forming the second passivation layer includes depositing silicon nitride.

20. The method of claim 10, wherein the micro-lens layer is made from a material that includes photoresist.

* * * * *